(12) United States Patent
Shastri et al.

(10) Patent No.: US 7,269,809 B2
(45) Date of Patent: Sep. 11, 2007

(54) INTEGRATED APPROACH FOR DESIGN, SIMULATION AND VERIFICATION OF MONOLITHIC, SILICON-BASED OPTO-ELECTRONIC CIRCUITS

(75) Inventors: Kalpendu Shastri, Allentown, PA (US); Soham Pathak, Allentown, PA (US); Prakash Gothoskar, Allentown, PA (US); Paulius Mosinskis, Richlandtown, PA (US); Bipin Dama, Bridgewater, NJ (US)

(73) Assignee: SiOptical, Inc., Allentown, PA (US)

( * ) Notice: Subject to any disclaimer, the term of this patent is extended or adjusted under 35 U.S.C. 154(b) by 138 days.

(21) Appl. No.: 11/159,283

(22) Filed: Jun. 22, 2005

(65) Prior Publication Data

US 2005/0289490 A1    Dec. 29, 2005

Related U.S. Application Data

(60) Provisional application No. 60/582,235, filed on Jun. 23, 2004.

(51) Int. Cl.
*G06F 17/50* (2006.01)
*G06F 17/10* (2006.01)

(52) U.S. Cl. ............... 716/5; 716/1; 716/2; 716/4; 716/6; 716/7; 716/18; 703/2; 703/13; 703/14; 703/17

(58) Field of Classification Search .............. 716/1, 716/4–7, 10, 18; 703/2, 13, 14; 257/536
See application file for complete search history.

(56) References Cited

U.S. PATENT DOCUMENTS

| 5,222,030 A | 6/1993 | Dangelo et al. |
| 5,914,889 A | 6/1999 | Cohen et al. |
| 5,930,150 A | 7/1999 | Cohen et al. |
| 6,110,217 A * | 8/2000 | Kazmierski et al. .......... 703/14 |

(Continued)

OTHER PUBLICATIONS

Abdennadher; "Behavioral modeling of a SONET/SDH transceiver using HDLA"; Feb. 27-29, 2000; Mixed-Signal Design, 2000. SSMSD. 2000 Southwest Symposium on; pp. 73-76.*

(Continued)

*Primary Examiner*—Paul Dinh
*Assistant Examiner*—Helen Rossoshek
(74) *Attorney, Agent, or Firm*—Wendy W. Koba

(57) ABSTRACT

Computer-aided design (CAD) tools are used to perform the integrated design, verification and layout of electrical and optical components in a monolithic, silicon-based electro-optic chip. Separate top-level behavioral logic designs are prepared for the three different types of elements included within the final, silicon-based monolithic structure: (1) digital electronic integrated circuit elements; (2) analog/mixed signal electronic integrated circuit elements; and (3) opto-electronic elements (including passive and active optical elements). Once the behavioral logic design is completed, the results are combined and co-simulated. A physical layout design is developed and verified for each different type of element in the circuit. The separate physical layouts are then co-verified, to assess the properties of the overall physical design. The results of the co-simulation are compared to the results of the co-verification, with alterations made in the logic design and/or the physical layout until the desired operating parameters are obtained. Once the desired results are generated, conventional wafer-level fabrication operations are then considered to provide a final product ("tape out").

18 Claims, 3 Drawing Sheets

U.S. PATENT DOCUMENTS

| | | | |
|---|---|---|---|
| 6,446,243 B1 * | 9/2002 | Huang et al. .................. 716/7 |
| 6,470,482 B1 | 10/2002 | Rostoker et al. |
| 6,480,816 B1 * | 11/2002 | Dhar ........................ 703/14 |
| 6,502,223 B1 * | 12/2002 | Keller et al. ................ 716/5 |
| 6,587,995 B1 * | 7/2003 | Duboc et al. ................ 716/4 |
| 6,668,364 B2 * | 12/2003 | McElvain et al. ............ 716/7 |
| 6,718,522 B1 * | 4/2004 | McBride et al. ............. 716/4 |
| 6,745,372 B2 | 6/2004 | Côté et al. |
| 6,807,658 B2 * | 10/2004 | Mielke et al. ............... 716/6 |
| 6,815,729 B1 | 11/2004 | Brophy et al. |
| 6,816,825 B1 | 11/2004 | Ashar et al. |
| 6,826,739 B2 * | 11/2004 | Frerichs ..................... 716/10 |
| 6,845,184 B1 | 1/2005 | Yoshimura et al. |
| 6,895,136 B2 | 5/2005 | Deliwala |
| 6,898,767 B2 | 5/2005 | Halstead |
| 6,969,903 B2 * | 11/2005 | Eshun et al. ............... 257/536 |
| 6,980,945 B2 * | 12/2005 | Elias ........................ 703/17 |
| 6,983,443 B2 * | 1/2006 | Korzyniowski et al. ...... 716/18 |
| 7,031,889 B1 * | 4/2006 | McBride ..................... 703/2 |
| 7,055,113 B2 * | 5/2006 | Broberg et al. .............. 716/1 |
| 7,065,481 B2 * | 6/2006 | Schubert et al. ............ 703/14 |
| 2003/0195736 A1 * | 10/2003 | Ghosh et al. ................ 703/14 |
| 2004/0107085 A1 * | 6/2004 | Moosburger et al. ......... 703/13 |
| 2005/0076316 A1 * | 4/2005 | Pierrat et al. ................. 716/4 |

OTHER PUBLICATIONS

Iyer et al.; Design and development of optoelectronic mixed signal system-on-package (SOP): May 2004; Advanced Packaging, IEEE Transactions on [see also Components, Packaging and Manufacturing Technology, Part B: Advanced Packaging, IEEE Transactions on]; vol. 27, Issue 2, pp. 278-285.*

* cited by examiner

INTEGRATED APPROACH FOR DESIGN, SIMULATION AND VERIFICATION OF MONOLITHIC, SILICON-BASED OPTO-ELECTRONIC CIRCUITS

CROSS-REFERENCE TO RELATED APPLICATIONS

This application claims the benefit of Provisional Application No. 60/582,235, filed Jun. 23, 2004.

TECHNICAL FIELD

The present invention relates to the automated design, layout and verification of integrated circuits and, more particularly, to the co-simulation and co-verification of both the optical and electrical circuit arrangements present in a silicon-based opto-electronic circuits.

BACKGROUND OF THE DISCLOSURE

Today's integrated circuits consist of as many as a billion transistors, a large number of input/output pins, and provide extensive functionality. To support the design, simulation, verification, place-and-route, and layout of these integrated circuits at the system, chip and logic levels, the integrated circuit (IC) industry has developed highly robust, well-established and standardized computer-aided design (CAD) tools, particularly electronic CAD (E-CAD) and methodologies. The E-CAD tools support digital, analog or mixed signal integrated electronic circuits. Generally, IC designers use libraries of circuit, gate and/or logic elements that are available through the well-known E-CAD software tools, or develop "custom" tools in-house to meet specific needs. The power of the standardized E-CAD tools has significantly fueled the growth and maturity of the IC industry.

Integrated circuit designs may employ custom, semi-custom, or a combination of custom and semi-custom design methodologies. "Custom" refers to the creation of a new physical layout for each design. Semi-custom refers to the use of predefined circuit elements, such as "gate array" and "standard cell" elements. Gate arrays employ a set of pre-defined functions fabricated on a semiconductor wafer that may be later interconnected to implement a design. Standard cell technologies provide a library of low-level circuit functions each having a predefined physical layout. The predefined physical layout (or "cells") typically have a common dimension such as width or height such that they may be placed in rows and blocks, the order determined by functions to be implemented and routing of interconnect between cells or groups of cells.

In developing an integrated circuit, a designer may partition a design into various functional blocks and then design circuitry for each functional block or re-use a design for a functional block if a previous design meets size, power and performance criteria. Circuit design most frequently employs a hardware descriptive language (HDL) that specifies circuit elements and the connection between elements. Verilog® is a commonly used HDL and is the topic of IEEE Std 1364. Verilog is a registered trademark of Cadence Design Systems, headquartered in San Jose, Calif. Verilog may be used to specify the initial design, to provide input to simulation and synthesis tools, and to check post-layout operation. A version of HDL suitable for use with analog circuits (A-HDL), or for Very high speed integrated circuit HDL (VHDL)—including VHDL-AMS for analog/mixed signal applications, are also known in the art.

At times, the pre-defined set of cells of a standard cell library may not provide a desired function, or may not provide the speed, size or power consumption desired. In these circumstances, new cells may be created, or a custom block of logic incorporating the desired function and capabilities may be designed. The design of the custom block of logic may employ "SPICE" (Special Programs for Interactive Circuit Elements) to specify and simulate the design. Some product versions of SPICE support both logical and timing simulation. However, SPICE simulation is extremely slow when compared to simulation employing an HDL netlist model. When designs include both standard cell and custom logic sections, a problem arises when attempting to simulate the entire design. The custom logic may exist simply as a "black box" wherein operation of standard cell and custom logic are separately simulated; simulation comprising both sections is not performed. A behavioral model, such as may be written in the C programming language, may be employed for function simulation, but such models do not allow for timing analysis.

Besides the problem of standard cells vs. custom logic, more and more integrated circuits are being formed that include both electronic circuit elements and optical circuit elements, particularly in light of the use of relatively thin silicon layers on an SOI substrate to support both types of elements in a monolithic structure.

The optics industry is in a similar state today as the electronic IC industry was in the 1960's. As such, today's optics industry lacks a common technology platform to integrate different components (building blocks) to make a subsystem. As a result, the current optical industry at large has a highly "un-integrated" approach for designing, simulating and verifying the mostly discrete optical components and optical systems. The few existing design, simulation and verification tools for optical elements tend to be overly specific to a particular type of optical device, or a system of optical components. Indeed, these tools have generally been developed for III-V based optical devices, not the silicon components used in the inventive integrated arrangement.

Recently, however, many factors have come together to make the integration of optical and electrical circuits a reality, allowing for optics and electronics to be incorporated on a monolithic platform using standard CMOS processing technology (as widely accepted by the IC industry). This approach towards silicon-based IC and optics integration aspires to leverage the discipline, maturity and capability of the IC industry into the monolithic platform. Recent efforts to demonstrate the feasibility of this approach are highly promising. To support this effort of integration, however, there is a need to design, simulate and verify both the optical and electronic components, preferably using the same tools during the design and development phases.

E-CAD tools, used for the design and development of traditional electronic integrated circuits, utilize various types of parameters that essentially characterize and model the electronic integrated circuits. These parameters can be the signal inputs, outputs, clock signal, time delays, load, voltages, and so on. The characterization of the electronic circuit elements enables the designers to design, simulate and verify the circuits prior to mask and fabrication. These parameters can be in analog or digital format, and are readily available within various E-CAD software libraries.

Optical modeling, as mentioned above, has heretofore been limited to use with traditional III-V-based optical devices. With the advent of silicon-based optical devices, and the integration of optical (i.e., passive optical devices), electronic and opto-electronic (i.e., active optical devices)

components, the need has arisen for a methodology to simplify the fabrication steps associated with such a monolithic design.

SUMMARY OF THE INVENTION

The need remaining in the prior art is addressed by the present invention, which relates to the use of electronic computer-aided design (E-CAD) tools to perform circuit layout and, more particularly, to the integrated design, verification and layout of optical and electrical components in a monolithic, silicon-based electro-optic chip so as to allow for the use of opto-electronic CAD (OE-CAD) tools to be used in the circuit design process.

In accordance with the present invention, conventional simulation tools associated with the design and fabrication of digital electronic devices and "mixed"/analog electronic device are re-characterized for use with silicon-based optical devices and opto-electronic devices (both passive and active devices). The methodology allows for the separate types of elements (i.e., digital IC elements, analog/mixed IC elements and opto-electronic elements) to be individually defined and simulated. Thereafter, a "co-simulation" process is performed that uses as inputs the results from the three separate simulation processes to assess the "logic" results of the complete arrangement. The three separate simulation results are then used as inputs to three separate physical layout routines to be verified. Again, the three separate layouts are used as inputs to a "co-verification" process to review the actual layout of the complete arrangement. In accordance with the present invention, the co-simulation results are checked against the co-verification results. If these results are in agreement, the circuit is ready for "tape out" (the process used to define the individual fabrication steps for the final circuit arrangement). Otherwise, problem(s) is/are identified with one or more of the steps in the process, adjustments are made and the co-simulation and co-verification processes are performed for a second time. Again, if the results are not satisfactory, the process is adjusted and re-run until a sufficient agreement in results is achieved.

It is an aspect of the present invention that various and different processes may be used within each process, with different interfaces then required to allow for the results to be integrated before performing the co-simulation or co-verification processes.

In one embodiment of the present invention, a recursive digital integrated circuit logic design is developed using "register transfer level" (RTL) circuits, which are recursively synthesized, simulated and verified until the final design meets the desired objectives. In a similar manner, a conventional analog/mixed circuit design tool is used to specify in schematic form, simulate and verify the analog/mixed electronic integrated circuits. In accordance with the present invention, the opto-electronic components are simulated using, for example, hardware description language (HDL), particularly analog HDL (A-HDL). In this case, an optical simulation is performed to verify the performance of the optical components in the opto-electronic arrangement, with a conventional device simulation used to verify the performance of the associated electrical devices.

Other and further embodiments of the present invention will become apparent during the course of the following discussion and by reference to the accompanying drawings.

BRIEF DESCRIPTION OF THE DRAWINGS

Referring now to the drawings.

DETAILED DESCRIPTION

In its most general sense, the present invention can be viewed as performing separate top-level behavioral logic designs for the three different types of elements included within the final, silicon-based monolithic structure. The three different types of elements, as mentioned above, can be defined as: (1) digital electronic integrated circuit elements; (2) analog/mixed signal electronic integrated circuit elements; and (3) opto-electronic elements (including passive and active optical elements). Once the behavioral logic design is completed, the results are combined and co-simulated. A physical layout design is developed and verified for each different type of element in the circuit. The separate physical layouts are then co-verified, using a predefined set of test vectors, to measure the properties of the overall physical design. The annotated results (complete with definitions of parasitic capacitances and resistances, for example) is then re-simulated and compared with the prior simulation, with alterations made in the logic design and/or the physical layout until the desired operating parameters are obtained. Once the desired results are generated, conventional wafer-level fabrication operations are then considered to provide a final product ("tape out").

A significant aspect of the system of the present invention is the need to develop a library of "schematics" of exemplary silicon-based optical devices to use during the logic design and physical layout phase. Typical optical devices include various passive elements (waveguides, prisms, mirrors, gratings, etc.) as well as active elements (MZIs, optical detectors, ring resonators, etc.). Advantageously, the use of silicon-based devices in today's SOI-based monolithic structures allows for existing schematic capture tools to be employed for this characterization. A particular concern for the optical layout is the connectivity between components, which takes the form of optical waveguides. In contrast to the electrical connections in terms of "wires" or metal paths on a circuit, the length and shape of the waveguide-based optical connections are significant design considerations.

Figure 1:
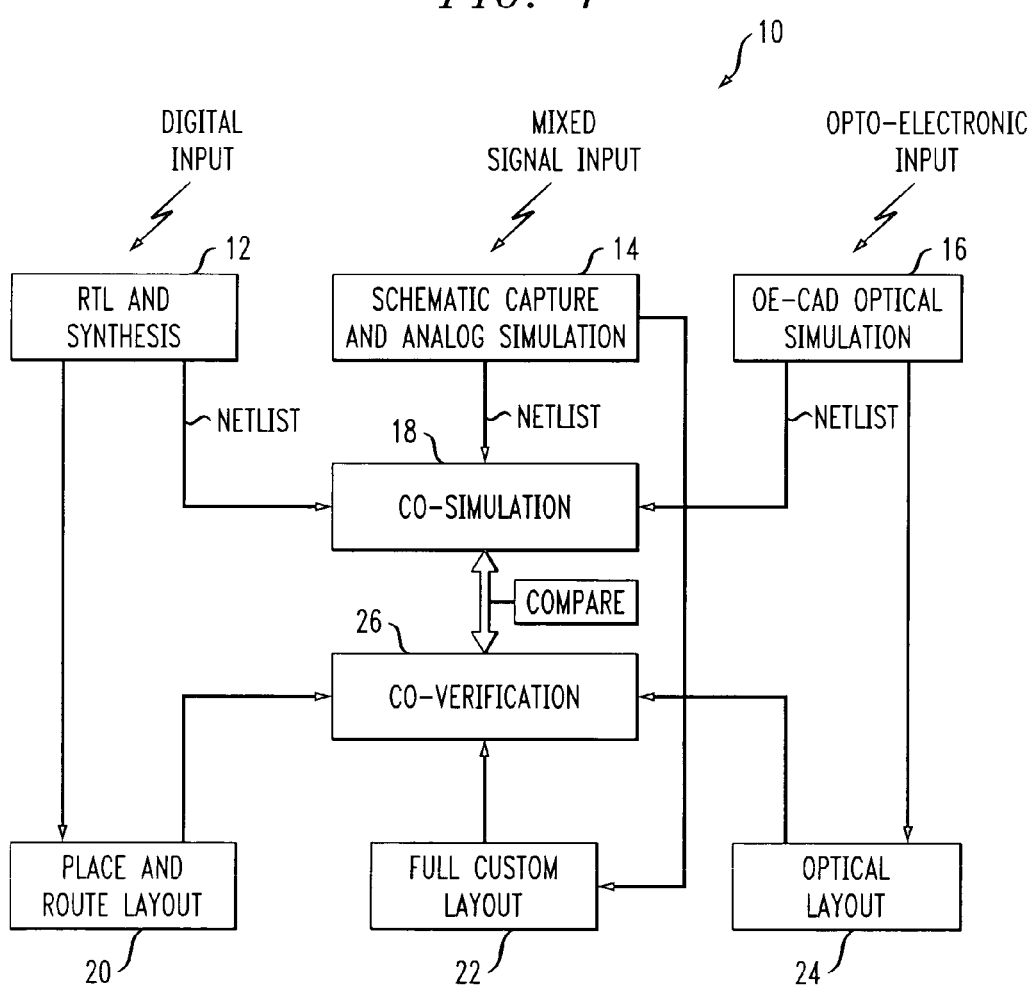
FIG. 1 illustrates, in block diagram form, an exemplary design architecture that may be used to provide the desired co-simulation and co-verification of the three types of elements formed in the silicon-based monolithic circuit structure in accordance with the present invention.

FIG. 1 contains, in simplified block diagram form, an exemplary architecture 10 for implementing the integrated approach for forming a monolithic, silicon-based opto-electronic circuit in accordance with the present invention. As shown, a set of three separate modules are initially used to define and simulate the three types of elements to be included in the monolithic arrangement: (1) digital electronic elements, defined and simulated in a first module 12; (2) analog/mixed signal electronic circuit elements, defined and simulated in a second module 14; and (3) opto-electronic circuit elements, defined and simulated in a third module 16.

In particular, first module 12 performs behavioral modeling of the digital integrated circuits using, for example, HDL languages (such as Verilog and/or VHDL). The output from first module 12 is a synthesized HDL netlist calling for pre-constructed and pre-characterized standard cells that are utilized to define the desired digital circuitry. Second module 14, associated with the design and simulation of the analog/mixed signal elements may use a schematic capture tool (such as, for example, Cadence Composer) to develop the desired model, since as is known in the art, the definition and design of analog/mixed circuit cannot always be performed by using standard cells. Subsequently, the results of the analog/mixed signal logic design is then converted to an HDL netlist, similar to the output from first module 12.

In considering the essential characterization of passive and active optical elements, there are various parameters that are analog in nature, such as optical loss, optical gain, changes in effective refractive indices, etc. The passive and active optical elements can thus be modeled using their optical parameters, just as the electronic components are modeled. Optical "standard cells", corresponding to a schematic optical library, can thus be formed and used within third module 16 to define the required active and passive optical elements. Again a netlist (in terms of either a schematic or a set of code) is generated as an output.

Referring to FIG. 1, the netlist outputs from modules 12, 14 and 16 are applied as inputs to a co-simulation arrangement 18. In accordance with the present invention, it has been found that the mere combination of the netlist outputs will lead to an unsatisfactory result in terms of the circuit design and layout. Indeed, the various electrical and optical parameters of the digital, analog/mixed signal and opto-electronic elements interact within one another and modify the results of the simulation. Thus, a "co-simulation" is performed simultaneously, where the three separate types of elements are simulated in concert. The ability to perform a co-simulation process is considered to be a significant aspect of the present invention, in terms of assessing the operational abilities of the monolithic arrangement.

Figure 2:
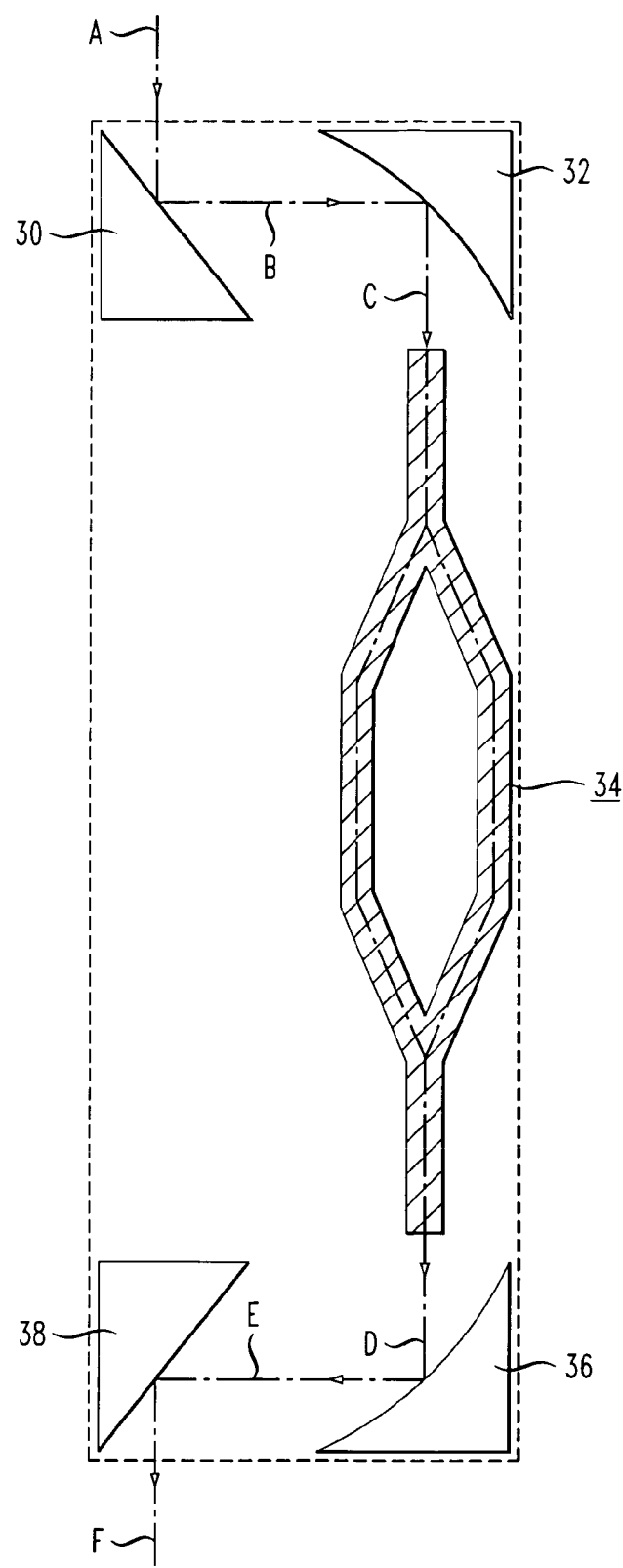
FIG. 2 illustrates an exemplary optical element that can be developed using a layout tool commonly employed for the layout of electronic elements.

The netlist outputs from modules 12, 14 and 16 are also provided as separate inputs to arrangements for performing the physical layouts of each of the different types of elements. As shown, the netlist output from digital simulation module 12 is applied as an input to a "place and route" layout element 20, layout element 20 being well-known in the art. A full custom layout element 22 is used to derive the physical layout of the analog/mixed signal arrangement, based on the netlist output from analog simulation module 14. An optical layout element 24 performs the optical layout process, and the three "layout" outputs are then supplied as inputs, in accordance with the present invention, to a co-verification element 26. With respect to the optical layout, conventional Design Rule Checking (DRC) can be implemented to verify that the design adheres to the rules specified by a given foundry. However, complications arise when the physical representation of the layout versus the schematic needs to be verified (such as when using a Layout Versus Schematic (LVS) tool). In accordance with the present invention, a "recognition" layer is added to the verification process that marks the various points within a defined optical element, then defining the path of a light beam as it passes through the structure. FIG. 2 contains an example of the application of this process to a conventional Mach-Zehnder interferometer (MZI) structure. Referring to FIG. 2, an input light beam follows a first path A and encounters a turning mirror 30. The light beam then follows path B and impinges a focusing mirror 32 that re-directs the light beam along path C and into an input port of an MZI 34. The output beam from MZI 34 follows along a path D, where it then impinges an output mirror 36 so as to be focused into an optical path E. The signal is then re-directed by a turning mirror 38 into an output signal path F. The connectivity of the various optical paths A-F can be likened to the metal connectivity associated with the layout of convention integrated circuits. By using this analogy, therefore, one is able to define an optical element that can be recognized by existing verification toolsets, as discussed above. As with the inventive co-simulation step, a co-verification process is used that takes into account the various parameters associated with the layout of both optical and electronic elements.

Once the co-verification and co-simulation processes are completed, the results of these processes are compared. If the results are in reasonable agreement, it is presumed that the complete design will function as desired, and the set of data created from the process can then be used in a conventional "tape out" to define the specific fabrication steps. Alternatively, if there are differences in result between the co-verification and co-simulation processes, one or more feedback signals are directed back to specific modules/elements that need to be modified to bring closure to the process. For example, the "layout" of a specific optical element may need to be modified to bring the co-verification process into agreement with the co-simulation process. Indeed, various different elements may need some sort of adjustment. Once the updated netlists and/or layouts are completed, the co-simulation and co-verification processes are performed again and the outputs are again compared. This comparison/feedback process is continued until a pre-defined degree of agreement between the two is obtained.

Figure 3:
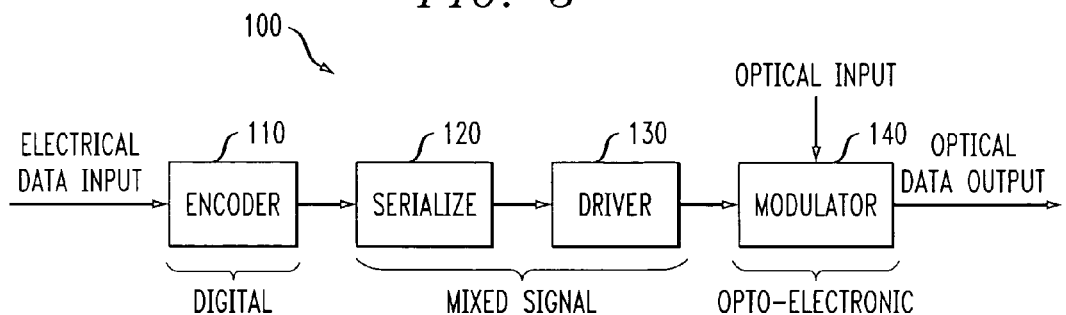
FIG. 3 contains a simplified block diagram of an exemplary opto-electronic transmitter channel that may be analyzed to form the integrated design process in accordance with the present invention.
Figure 4:
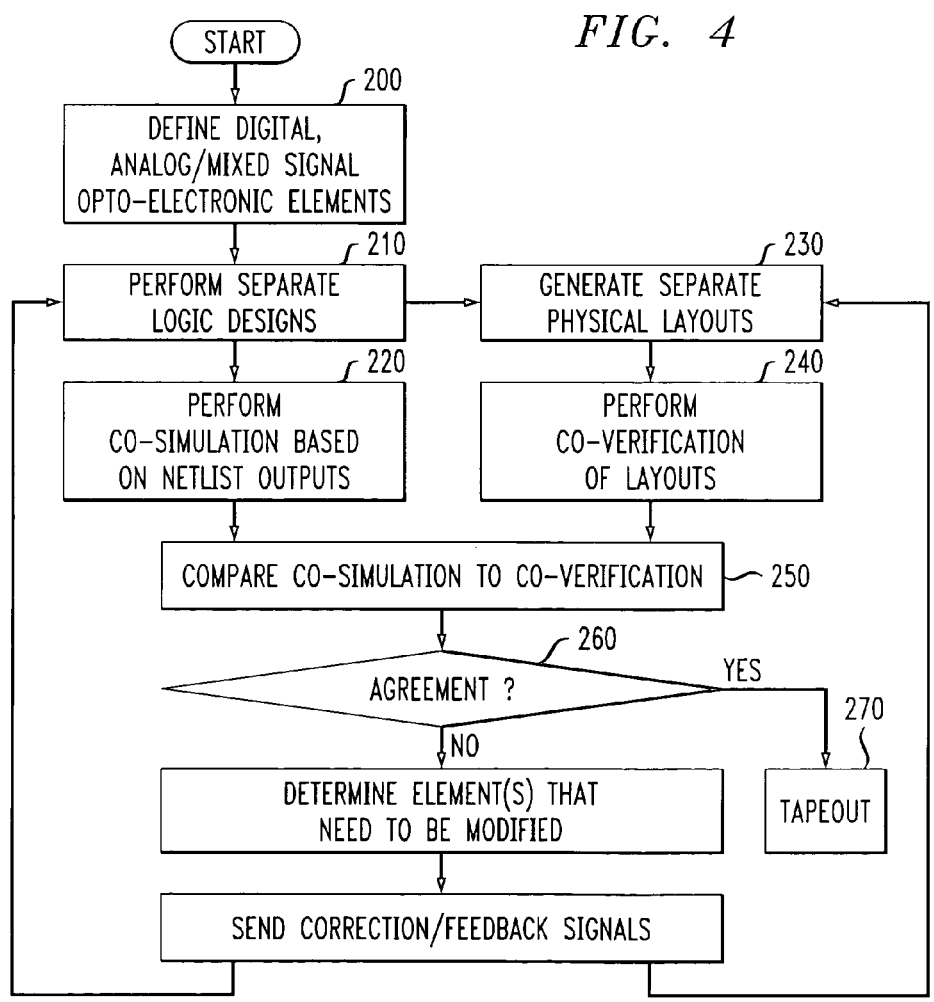
FIG. 4 is a flowchart of the process that may be used in conjunction the transmitter channel of FIG. 3 to develop the integrated, monolithic circuit design.

FIGS. 3 and 4 illustrate an exemplary application of the inventive co-simulation/co-verification design process for a transmitter channel including each type of element as described above. In particular, FIG. 3 illustrates a high-level block diagram of the exemplary transmitter channel elements and FIG. 4 contains a flowchart for an exemplary process that may be used to implement the integrated design methodology of the present invention. Referring to FIG. 3, an exemplary transmitter channel 100 is illustrated as comprising an encoder 110 that receives the input digital data signal that is desired to be transmitted. Encoder 110, as is known in the art, functions to translate the digital input signal into a particular coded form (such as NRZ) suitable for use in the remainder of the transmitter channel. The output from encoder 110 is subsequently applied as an input to a serializer 120, followed by a driver 130. Serializer 120 and driver 130 are typically implemented as a combination of analog and digital ("mixed signal") circuitry.

The output from driver circuit 120—the analog encoded information signal—is subsequently applied as an input to an electro-optic modulator 140. A separate continuous wave (CW) optical signal is applied as a second input to modulator 140. As is well-known in the art, the electrical input signal is used to modulate the CW optical signal, providing as an output an optical information signal.

In accordance with the teachings of the present invention, it is desired to develop an integrated arrangement, incorporating all of these transmitter channel elements, so that the entire transmitter channel may be implemented on a single silicon substrate as a monolithic arrangement. FIG. 4 contains a flowchart illustrating, at a high level, the methodology employed to generate the fabrication process for the integrated transmitter channel 100 as shown in FIG. 3. The process begins at step 200, as shown, by defining the separate "blocks" in the high-level circuit arrangement that may be categorized as "digital", "analog/mixed signal" and "opto-electronic". In this particular case, encoder 110 is defined as a typical "digital" electronic integrated circuit that may synthesized using standard cells and subjected to a conventional "place and route" layout process. Serializer 120 and driver 130 are defined as typical analog circuitry, including a digital-to-analog converter (thus "mixed signal") which can be synthesized using the A-HDL and/or SPICE processes, as discussed above. Electro-optic modulator 140 is defined as a typical opto-electronic element, utilizing both electrical and optical inputs to form an optical output signal.

Once the various elements have been defined and categorized, each type of element is separately subjected to a logic design process suited for the particular type of element (step 210). That is, an RTL and synthesis process may be used for digital encoder 110, a SPICE simulation for serializer 120 and driver 130, and a number of optical "standard cells" can be defined and used in conjunction with electronic "standard cells" and HDL definitions to synthesize the modulation functionality of electro-optic modulator 140.

Subsequent to the completion of the logic design of the three types of elements, the logic design data (typically in the form of a netlist—in the form of code or schematic) is provided as input to a co-simulation process 220. In accordance with the present invention and as discussed above, the co-simulation process is utilized to ensure that the various types of elements will function together to provide the desired output. That is, the logic designs of each type of element are melded together in a single simulation process to assess the interworking of the digital element with the mixed signal elements, and further with the opto-electronic element. The netlist outputs from the separate logic design processes are also applied as inputs, as shown in step 230, to a physical layout process that functions to separately provide the physical layout of the digital element, the mixed signal elements and the opto-electronic element. In a preferred embodiment of the present invention, the three layouts are submitted to internal verification processes to ensure that each separate layout is accurate before initiating the co-verification process.

The (verified) data defining the three separate physical layout arrangements is then applied as an input to a co-verification routine, as shown in step 240. As discussed above, a co-verification process is used in accordance with the present invention to ensure that the layouts of the three types of elements will work together in a proper manner to allow for accurate operation of transmitter channel 100. Once both the co-simulation and co-verification processes have been completed, the results are compared (step 250) and a determination is made regarding the degree of agreement between the results (step 260). If the results are sufficiently in agreement, the complete design of the monolithic arrangement is completed, and the process moves to the "tape-out" stage (step 270).

In accordance with the present invention, if there exists significant disagreement between the results, a determination is made (step 280) regarding the particular process element(s) that may be modified to improve the results (in either the co-simulation, the co-verification, or both). Once the particular affected elements are identified, a correction/feedback signal is applied as an input to allow for an adjustment to be made to the logic design, physical layout or both. The co-simulation and co-verification processes are then performed again and an updated comparison is performed. The process may continue in this manner until there is sufficient agreement between the co-simulation and co-verification results.

The foregoing description of various implementations of the present invention has been presented only for the purposes of illustration and description. They are not intended to be exhaustive or to limit the invention to the disclosed forms. Accordingly, many modifications and variations will be apparent to those skilled in the art, with the scope of the present invention being limited only by the claims appended hereto.

What is claimed is:

1. An arrangement for performing the design, layout and verification of a monolithic integrated circuit structure comprising at least one digital electronic element, at least one analog/mixed signal element and at least one opto-electronic element, the arrangement comprising:
   a plurality of design modules for defining and synthesizing in separate ones of said plurality of design modules the at least one digital element, the at least one analog/mixed signal element and the at least one opto-electronic element in terms of behavioral/logic design requirements;
   a co-simulation module, responsive to the logic design outputs from the plurality of design modules, for simultaneously simulating each type of element and assessing the logical proficiency of the combination;
   a plurality of physical layout modules, each responsive to the logic design output from an associated design module of the plurality of design modules, for converting each logic design into an associated physical layout arrangement;
   a co-verification module, responsive to the plurality of physical layout outputs from the plurality of physical layout modules, for simultaneously verifying the physical placements of each type of element and assessing the performance of the combination of elements; and
   a comparator responsive to the outputs from the co-simulation and co-verification modules for determining if a satisfactory correlation between the logical proficiency and physical placement outputs has been reached, allowing for a final tape-out to be performed.

2. The arrangement as defined in claim 1 wherein the design module associated with the at least one digital element utilizes register transfer level (RTL) circuits to provide the digital integrated circuit logic design.

3. The arrangement as defined in claim 1 wherein the design module associated with the at least one analog/mixed signal element utilizes a schematic capture design tool to provide the logic design.

4. The arrangement as defined in claim 1 wherein the design module associated with the at least one opto-electronic element utilizes an OE-CAD design tool for optical logic design.

5. The arrangement as defined in claim 1 wherein "netlists" are generated as outputs from the plurality of design modules.

6. The arrangement as defined in claim 1 wherein a "place and route" layout tool is used for the physical layout of the at least one digital electronic element.

7. The arrangement as defined in claim 1 wherein a full custom physical layout design is utilized within the design module associated with the at least one analog/mixed signal circuit element.

8. The arrangement as defined in claim 1 wherein a full custom physical layout design is utilized within the design module associated with the at least one opto-electronic circuit element.

9. A method of providing an integrated design, simulation and verification of a monolithic circuit arrangement including digital electronic elements, mixed signal elements, and opto-electronic elements, the method comprising the steps of:
   a) defining a set of elements to be included in the integrated design;
   b) creating separate logic designs for each type of element: digital, mixed signal and opto-electronic;
   c) combining the separate logic designs into an overall design and performing a co-simulation of the combined logic designs;
   d) generating separate physical layouts for each type of element, based on the logic designs created in step b);
   e) combining the separate physical layouts into an overall physical layout and performing a co-verification of the combined physical layout;
   f) comparing the co-simulation results to the co-verification results to determine if an acceptable correlation exists; and
   g) if acceptable, generating information needed for fabrication, otherwise;
   h) identifying specific logic and/or physical designs to be modified;
   i) performing the identified modifications; and
   j) repeating steps c) and e)-g) until an acceptable agreement in results in obtained.

10. The method as defined in claim 9 where prior to performing the co-simulation of step c), each logic design is separately simulated until a satisfactory result is achieved.

11. The method as defined in claim 9 where prior to performing the co-verification of step e), each physical layout is separately verified until a satisfactory result is achieved.

12. An arrangement for performing the design, layout and verification of an integrated circuit structure comprising a first unit including at least one digital electronic element, a second unit including at least one analog/mixed signal element and a third unit including at least one opto-electronic element, the arrangement comprising:
   a plurality of design modules for defining and synthesizing in separate ones of said plurality of design modules the at least one digital element, the at least one analog/mixed signal element and the at least one opto-electronic element in terms of behavioral/logic design requirements;
   a co-simulation module, responsive to the logic design outputs from the plurality of design modules, for simultaneously simulating each type of element and assessing the logical proficiency of the combination;
   a plurality of physical layout modules, each responsive to the logic design output from an associated design module, for converting the logic design into a physical layout arrangement;
   a co-verification module, responsive to the physical layout outputs from the plurality of physical layout modules, for simultaneously verifying the physical placements of each type of element and assessing the performance of the combination of elements; and
   a comparator responsive to the outputs from the co-simulation and co-verification modules for determining if a satisfactory correlation between the outputs has been reached, allowing for a final tape-out to be performed.

13. The arrangement as defined in claim 12 wherein the design module associated with the at least one digital element utilizes register transfer level (RTL) circuits to provide the digital integrated circuit logic design.

14. The arrangement as defined in claim 12 wherein the design module associated with the at least one analog/mixed signal element utilizes a schematic capture design tool to provide the logic design.

15. The arrangement as defined in claim 12 wherein the design module associated with the at least one opto-electronic element utilizes an (OE-CAD) design tool for optical logic design.

16. A method of providing an integrated design, simulation and verification of an integrated circuit arrangement including digital electronic elements, mixed signal elements, and opto-electronic elements formed on at least two separate structures, the method comprising the steps of:
   a) defining a set of elements to be included in the integrated design;
   b) creating separate logic designs for each type of element: digital, mixed signal and opto-electronic;
   c) combining the logic designs into an overall design and performing a co-simulation of the combined logic designs;
   d) generating separate physical layouts for each type of element, based on the logic designs created in step b);
   e) combining the physical layouts into an overall physical layout and performing a co-verification of the combined physical layout;
   f) comparing the co-simulation results to the co-verification results to determine if an acceptable correlation exists; and
   g) if acceptable, generating information needed for fabrication, otherwise;
   h) identifying specific logic and/or physical designs to be modified;
   i) performing the identified modifications; and
   j) repeating steps c) and e)-g) until an acceptable agreement in results in obtained.

17. The method as defined in claim 16 where prior to performing the co-simulation of step c), each logic design is separately simulated until a satisfactory result is achieved.

18. The method as defined in claim 16 where prior to performing the co-verification of step e), each physical layout is separately verified until a satisfactory result is achieved.

* * * * *